United States Patent [19]
Ovens et al.

[11] Patent Number: 5,430,408
[45] Date of Patent: Jul. 4, 1995

[54] TRANSMISSION GATE CIRCUIT

[75] Inventors: Kevin Ovens, Plano; Clive Bittlestone; Bob Helmick, both of Allen, all of Tex.

[73] Assignee: Texas Instruments Incorporated, Dallas, Tex.

[21] Appl. No.: 259,731

[22] Filed: Jun. 14, 1994

Related U.S. Application Data

[63] Continuation of Ser. No. 28,901, Mar. 8, 1993, abandoned.

[51] Int. Cl.⁶ .................. H03K 17/04; H03K 17/12
[52] U.S. Cl. .................................. 327/404; 327/403; 327/432; 327/433; 327/407
[58] Field of Search ............... 307/241, 242, 243, 263, 307/264, 296.7, 443, 446, 451, 570, 572, 579, 585, 645, 542; 327/403, 404, 405, 432, 433

[56] References Cited

U.S. PATENT DOCUMENTS

| | | | |
|---|---|---|---|
| 4,571,504 | 2/1986 | Iwamoto et al. | 327/404 |
| 4,611,135 | 9/1986 | Nakayama et al. | 327/404 |
| 4,855,623 | 8/1989 | Flaherty | 307/451 |
| 4,890,017 | 12/1989 | Masuda et al. | 307/446 |
| 5,036,232 | 7/1991 | Jungert et al. | 307/542 |
| 5,055,716 | 10/1991 | El Gamel | 307/446 |
| 5,068,548 | 11/1991 | El Gamel | 307/446 |
| 5,111,072 | 5/1992 | Seidel | 307/585 |
| 5,126,595 | 6/1992 | Hara et al. | 307/446 |
| 5,243,237 | 9/1993 | Khieu | 307/443 |

*Primary Examiner*—Timothy P. Callahan
*Assistant Examiner*—Terry L. Englund
*Attorney, Agent, or Firm*—Thomas G. Eschweiler; James C. Kesterson; Richard L. Donaldson

[57] ABSTRACT

A transmission gate circuit 20 includes a pull-up control circuit 15, a pull-down control circuit 17, and an electrical switch 19. Pull-up control circuit 15 and electrical switch 19 provide fast, complete transition from low-to-high at the output of circuit 20 thus improving circuit 20 speed as well as improving the switching speed of subsequent gates. Pull-down control circuit 17 and electrical switch 19 provide complete transition from high-to-low at the output of circuit 20. Transmission gate circuit 17 also provides increased drive such that circuit 20 may provide a gate fanout increase of 3X.

8 Claims, 5 Drawing Sheets

TRANSMISSION GATE CIRCUIT

This application is a Continuation of application Ser. No. 08/028,901, filed Mar. 8, 1993, now abandoned.

FIELD OF THE INVENTION

This invention deals with circuits and more particularly relates with transmission gates.

BACKGROUND OF THE INVENTION

In circuit design, circuit speed is a crucial performance criteria that differentiates one from competitors. With electronic systems requiring ever increasing speed, individual components must be improved to make the designer's goals a reality.

The speed of any circuit is dictated by the time required for any signal to propagate though the circuit. One of the most rudimentary circuits used in digital circuit design is the transmission gate. FIG. 1 illustrates a prior art CMOS transmission gate 10 having a PMOS transistor 12 and an NMOS transistor 14 connected in parallel. Logic signals V and V(bar) control transistors 12 and 14 allowing a voltage on the node labeled IN to be "transmitted" to the node labeled OUT. The time associated with the voltage transmission is considered the propagation delay of transmission gate 10. As circuits require greater performance it is obvious that circuits that provide decreased propagation delay are needed.

It is an object of this invention to provide a transmission gate circuit that provides improved performance by decreasing the propagation delay through the circuit. It is another object of the invention to provide a transmission gate circuit that provides improved loading capability. It is yet another object of this invention to provide a transmission gate circuit that achieves the above goals without substantially increasing the circuit's power dissipation. Other objects and advantages of the invention will become apparent to those of ordinary skill in the art having reference to the following specification together with the drawings herein.

SUMMARY OF THE INVENTION

A transmission gate circuit includes a pull-up control circuit, a pull-down control circuit, and an electrical switch. Pull-up control circuit and electrical switch provide fast, complete transition from low-to-high at the output of circuit thus improving circuit speed as well as improving the switching speed of subsequent gates. Pull-down control circuit and electrical switch provide complete transition from high-to-low at the output of circuit. Transmission gate circuit also provides increased drive such that circuit may provide a gate fan-out increase of 3X.

DESCRIPTION OF THE PREFERRED EMBODIMENT

Figure 1:
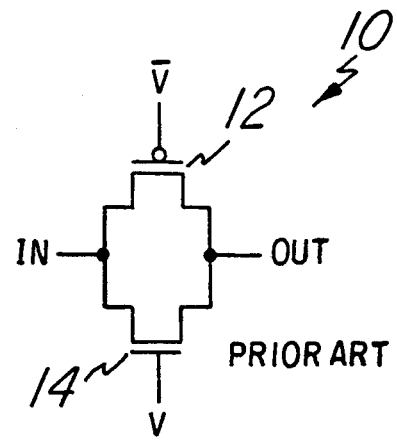
FIG. 1 is a circuit diagram illustrating a prior art CMOS transmission gate 10.
Figure 2:
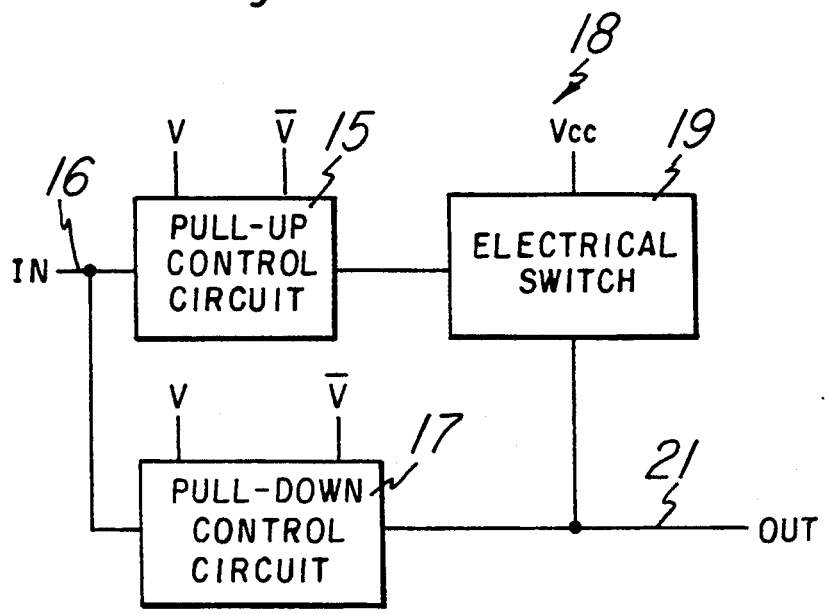
FIG. 2 is a block level diagram illustrating the invention.

FIG. 2 is block diagram illustrating the preferred embodiment of the invention. A transmission gate circuit 18 includes a pull-up control circuit 15 connected to a circuit input 16, control voltages, V and V(bar), and an electrical switch 19. A pull-down control circuit 17 is also connected to circuit input 16 and to switch 19 and forms a circuit output 21. Switch 19 is also connected to a supply voltage Vcc.

Circuit 18 is a transmission gate circuit that transmits a voltage value present at input 16 to output 21. The time needed to perform this task by circuit 18 is defined as the propagation delay of circuit 18. Pull-up circuit 15, when enabled by control voltages V and V(bar), activates switch 19 when input 16 transitions from a low-to-high voltage value. Switch 19, in response to pull-up control circuit 15, activates and pulls the voltage at output 21 up toward Vcc. As switch 19 completes its activation, output 21 is still less than Vcc due to the limitations of switch 19. Pull-down control circuit 17, activated by control voltages V and V(bar), completes the transition of output 21 such that output 21 is equal to Vcc which is equal to the high voltage value at input 16.

Circuit 18 also transmits the voltage value at input 16 to output 21 when transitioning from high-to-low. When this transition occurs pull-up control circuit 15, enabled by control voltages V and V(bar), deactivates switch 19 which initiates a voltage transition from high-to-low at output 21. Pull-down control circuit 17, also enabled by control voltages V and V(bar), dominates in pulling output 21 down from a high to low value.

Circuit 18 improves switching speed by approximately 300% by utilizing switch 19 to provide a lower effective impedance driving output 21 than prior art circuit 10. Switch 19 in conjunction with pull-down control circuit 17 also provide additional drive such that circuit 18 can drive a greater number of gates or alternatively a single gate having a much larger capacitive load.

Figure 3:
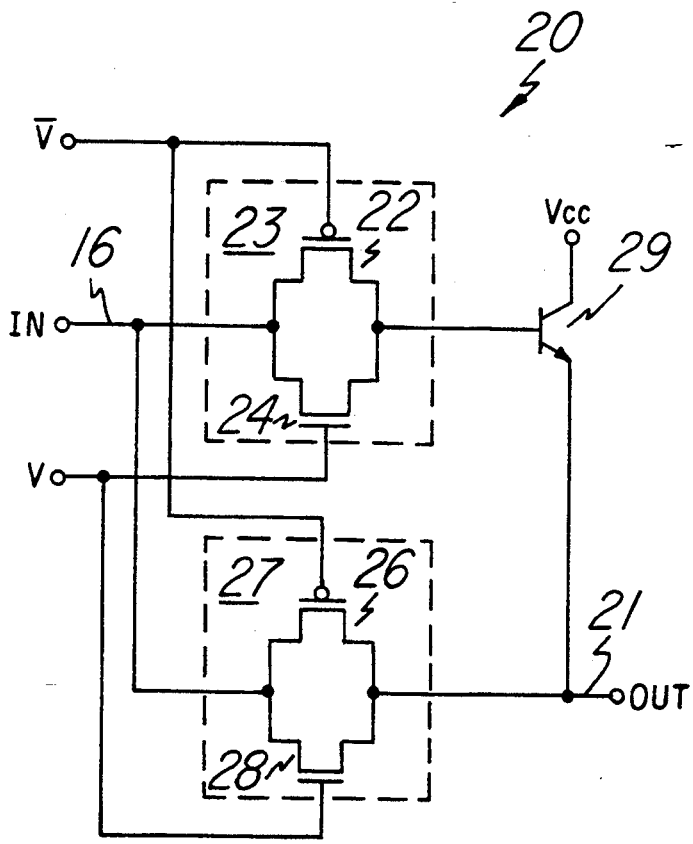
FIG. 3 is a circuit diagram illustrating a particular embodiment of the invention, a BiNMOS transmission gate circuit 20.

FIG. 3 is a circuit diagram illustrating the preferred embodiment of the invention, transmission gate circuit 20. Circuit 20 includes a first CMOS transmission gate 23, a second CMOS transmission gate 27, and a bipolar transistor 29. First transmission gate 23 consists of a PMOS transistor 22 connected in parallel with an NMOS transistor 24. A gate terminal of transistor 22 is connected to a voltage signal V(bar) and a gate terminal of transistor 24 is connected to a voltage signal V. One node of transmission gate 23 is connected to circuit input 16 and a second node of gate 23 is connected to a base terminal of transistor 29.

Second transmission gate 27 includes a PMOS transistor 26 connected in parallel with an NMOS transistor 28. A gate terminal of transistor 26 is connected to voltage signal V(bar) and a gate terminal of transistor 28 is connected to voltage signal V. A first node of transmission gate 27 is connected to circuit input 16 and a second node of gate 27 is connected to an emitter terminal of transistor 29 and forms output 21. Transistor 29 has a collector terminal connected to a voltage signal Vcc. Transmission gate circuit 20 provides improved performance by providing decreased signal propagation time (higher speed) and increased drive capability without an appreciable increase in power consumption.

Circuit 20 of FIG. 3 operates in the following manner. At an initial time t0 the voltage value at input 16 is low and the voltage value at control voltage V is low (therefore V(bar) is high). In this state transmission gates 23 and 27 are disabled and behave as open circuits. During this time the voltage value at input 16 may change without any impact on the voltage value at output 21. Before time t1 control voltage V goes high and control voltage V(bar) goes low thus enabling gates 23 and 27. At time t1 input 16 rises to a high level (the exact voltage level will depend upon the process being used). At t2 output 21 begins a three phase process that will quickly pull it up to voltage level Vcc (which is equal to the high voltage value at input 16).

During phase I (t2<t<t3) the high voltage value at input 16 is transmitted extremely quickly to the base terminal of bipolar transistor 29 which turns transistor 29 on. The timely presence of a high voltage at the base of transistor 29 is a significant difference over prior art circuit 10 because the base capacitance of transistor 29 is approximately 5-100 times smaller than the load capacitance of circuit 10 (the exact difference depends upon the gain of transistor 29 and the load being driven). Therefore the voltage at the base of transistor 29 increases at a rate primarily determined by an RC time constant where R=the "on" resistance of transmission gate 23, and C=the total representative base capacitance of transistor 29. Since RC during phase I is significantly smaller than circuit 10 the voltage at the base of transistor 29 increases much more quickly. Transistor 29 turns on as soon as its base is approximately 0.7 V greater than output 21. When transistor 29 is on, output 21 quickly increases toward Vcc. At time t3 the base voltage of transistor reaches V-Vt(M24) and NMOS transistor 24 turns off and phase I is completed. During phase I output 21 increases at its highest rate. When transistor 29 is on the impedance looking back into circuit 20 from output 21 is approximately 20-50 ohms while in prior art circuit 10 it is approximately 1000 ohms.

During phase II (t3<t<t4) NMOS transistor 24 is off and PMOS transistor 22 is still on. PMOS transistors are not as strong as NMOS transistors and therefore its ability to quickly pull the base terminal of transistor 29 up to the voltage at input 16 is decreased. This is best explained by looking at the new RC time constant during phase II where R=on resistance of PMOS transistor 22 and C=the base capacitance of transistor 29. Since R of phase II is larger than R of phase I then the RC time constant is larger in phase II and output 21 continues to increase toward Vcc but at a slower rate. Phase II concludes at t4 when the base of transistor 29 is at the voltage value equal to input 16. At this time transistor 29 is transitioning from on to off and output 21 is at Vcc-Vbe(Q29).

Figure 4:
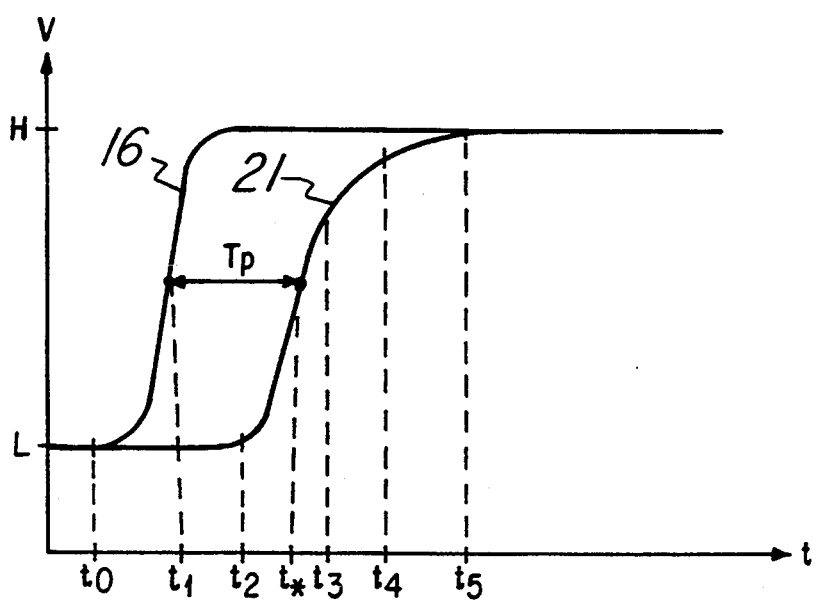
FIG. 4 is a timing diagram illustrating the three phase transition of circuit 20 and the propagation delay between input 16 and an output 21.

During phase III (t4<t<t5) second transmission gate 27, which has been on since t2, completes pulling output 21 up toward Vcc by transmitting input 16 to output 21. Since output 21 is already within a "Vt" of input 16 NMOS transistor 28 is off and PMOS transistor 26 is the only transistor on. The rate at which output 21 increases toward Vcc is dictated by a new RC time constant where R=the "on" resistance of PMOS transistor 26 and C=the effective capacitance of the load being driven. Since C in phase III is much larger than C during either phase I or II the rate of increase during phase III is slower than phase I and II. Output 21 reaches Vcc at time t5. Therefore the propagation delay (Tp), which is measured from a gate input threshold of input 16 to the gate input threshold of output 21, of circuit 20 is:

$$Tp = t_* - t_1$$

and is illustrated in FIG. 4. This propagation delay is approximately three times faster than prior art circuit 10.

It is obvious from this discussion how novel circuit 20 advantageously decreases propagation delay over prior art circuit 10 by reducing the effective RC time constant during phase I and II thereby quickly transmitting the voltage at input 16 to output 21 by pulling output 21 up to Vcc.

Figure 5:
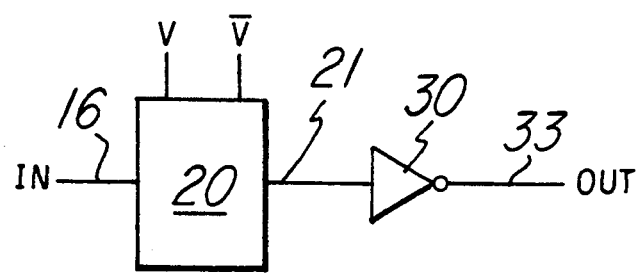
FIG. 5 is a schematic diagram illustrating circuit 20 driving a gate 30.
Figure 5A:
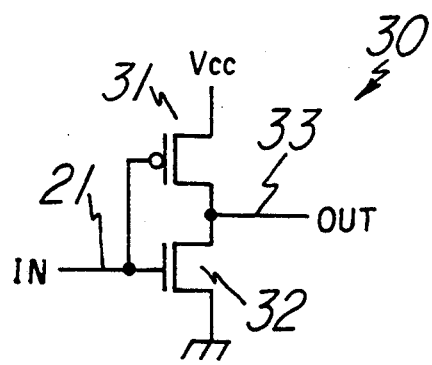
FIG. 5a is a circuit diagram illustrating gate 30 of FIG. 5.
Figure 6:
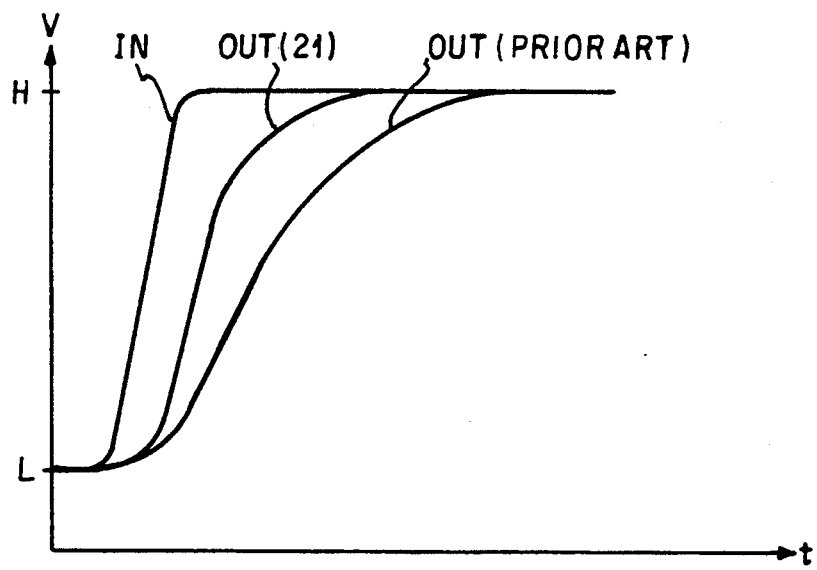
FIG. 6 is a timing diagram illustrating circuit 20 and its improvement over prior art circuit 10.
Figure 6A:
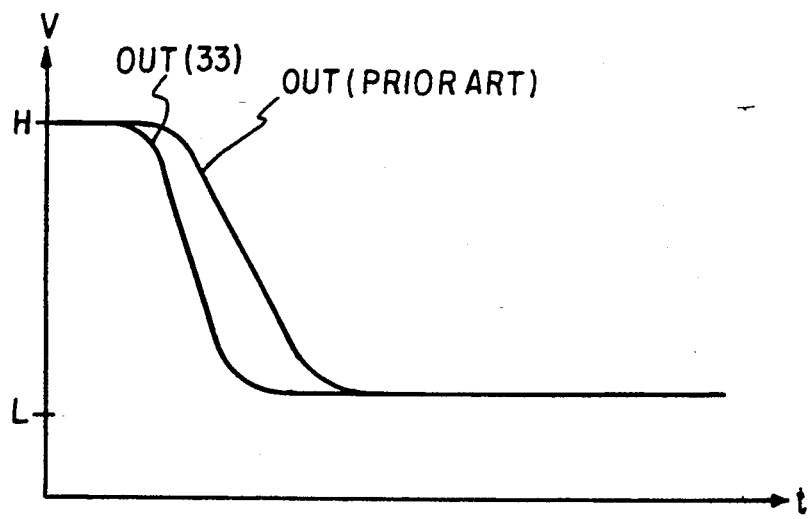
FIG. 6a is a timing diagram illustrating how circuit 20 improves the switching speed of gates it drives.

Circuit 20 of FIG. 3 not only has a smaller propagation delay time (Tp), but it also causes gates that it is driving to switch faster. FIG. 5 and FIG. 5a illustrate this feature. When circuit 20 transitions from a low-to-high voltage value output 21 increases to a high level very quickly as illustrated in FIG. 4. Since output 21 of circuit 20 drives gate 30, gate 30 will transition low. Since gate voltage at NMOS transistor 32 will be above its "Vt" NMOS transistor 32 will turn on and pull its output 33 low. However, the switching speed of output 33 is dictated by the drive capability of NMOS transistor 32. NMOS transistor's drive is given by:

$$I = (k'/2)(W/L)(Vgs - Vt)^2$$

neglecting any body effect. In the above formula, $k' = uC_{ox}$ wherein u is the mobility of electrons in the channel and $C_{ox}$ is the capacitance per unit area of the gate-to-channel capacitor. Additionally, W=the channel width, L=the channel length, Vgs=the gate-to-source voltage, and Vt=the transistor threshold voltage. It is obvious that if Vg which is output 21 of circuit 20 is large, output switching speed of output 33 will increase as a square function. Therefore circuit 20 improves its own propagation delay and also improves the switching speed of the gates it drives. This is readily seen in FIG. 6 and FIG. 6a which show the improved switching speed of output 21 and the improved switching speed of a gate output 33 being driven by circuit 20. When input 16 transitions from a high-to-low voltage value and control voltage V is high transmission gates 23 and 27 are enabled. When transmission gate 23 is enabled the low voltage value at input 16 is transmitted at a rate dictated by the appropriate RC time constant and the base of transistor 29 begins to transition to a low voltage value. As transistor 29 turns off and NMOS transistor 28 turns on, output 21 begins to go low. When the voltage at the base of transistor 29 reaches the "Vt" of PMOS transistor 22, PMOS transistor 22 turns off and NMOS transistor 24 remains on to bring the base all the way down to the low voltage at input 16 to ensure no leakage on transistor 29.

Transmission gate 27 plays the primary role in pulling output 21 down to the value at input 16. NMOS transistor 28 is sized large (approximately 10X the size of NMOS transistor 24) to handle the heavy loading at output 21. As output 21 reaches the "Vt" of PMOS transistor 26 it turns off and NMOS transistor 28 remains on. NMOS transistor stays on and ensures that output 21 becomes exactly equal to the value at input 16 such that no quiescent current exists. This ensures a low quiescent current Iccq which is highly desirable in systems requiring tight power management. Circuit 20 does not provide speed improvement in transitioning from high-to-low.

Figure 7:
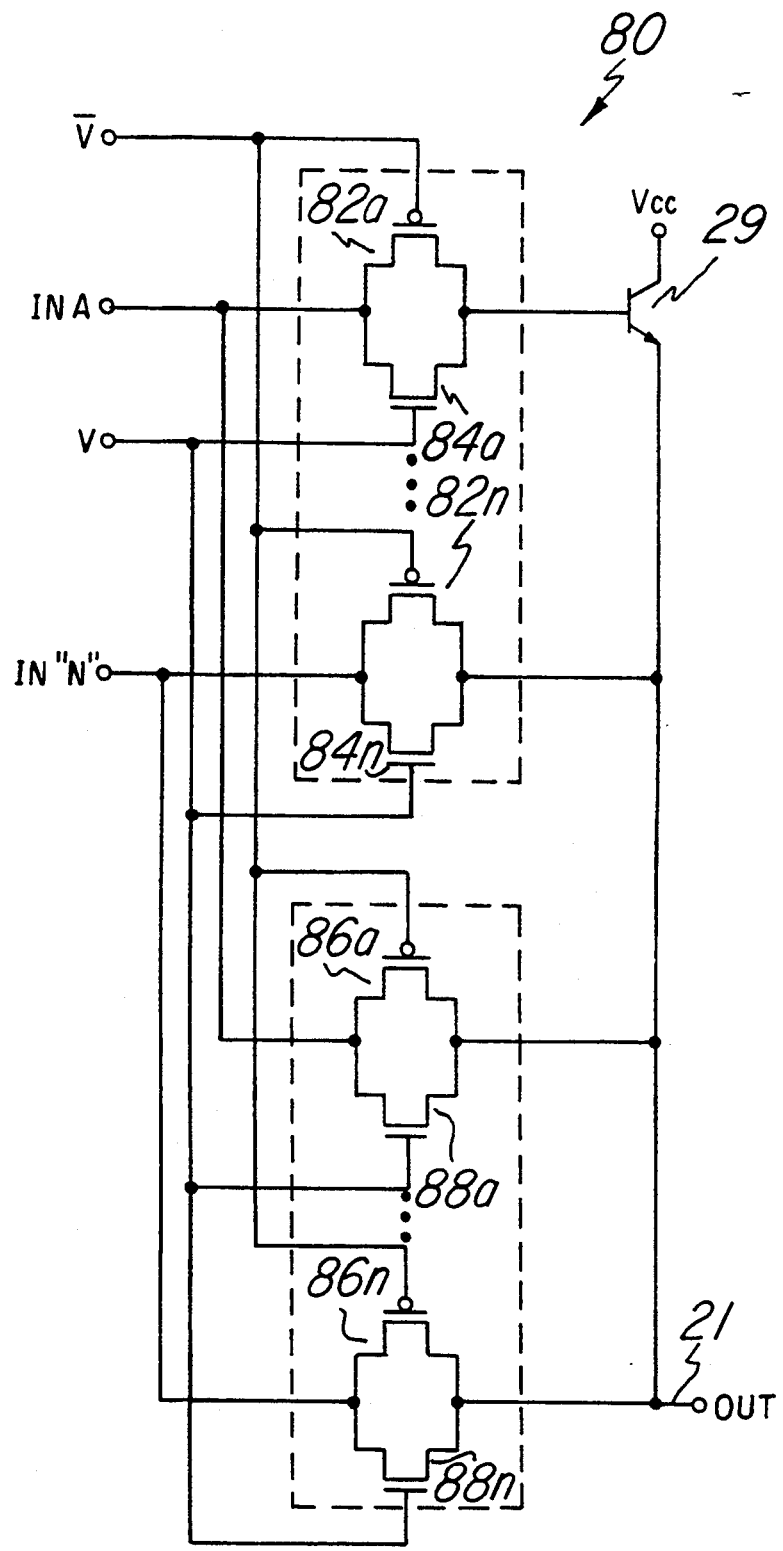
FIG. 7 is a circuit diagram illustrating an alternative embodiment of the invention.

FIG. 7 illustrates an alternative embodiment where transmission gates 23 and 27 of FIG. 3 are replaced by a plurality of CMOS transmission gates. CMOS transmission gates are made of PMOS transistors 82*a-n* and 86*a-n* and NMOS transistors 84*a-n* and 88*a-n*. This embodiment provides a multiplexer function by providing alternative data paths to the base of transistor 29 and to output 21.

Figure 8:
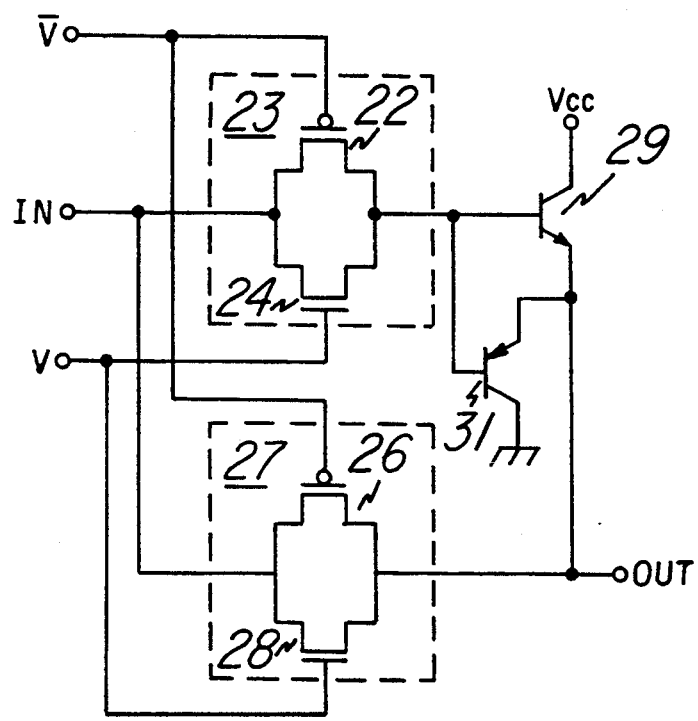
FIG. 8 is a circuit diagram illustrating another alternative embodiment of the invention.

FIG. 8 is another alternative embodiment with a second bipolar transistor used to provide increased speed when input 16 transitions from high-to-low by decreasing the loading similar to circuit 20 in FIG. 3 when input 16 transitions from low-to-high. Other embodiments using a pull-down transistor to increase the switching speed when output 21 transitions from high to low would also fall within the scope of this invention. One example would be an NPN transistor with its collector connected to output 21 and passing the complement of input 16.

Although the invention has been described with reference to the preferred embodiment herein, this description is not to be construed in a limiting sense. Various modifications of the disclosed embodiment will become apparent to persons skilled in the art upon reference to the description of the invention. It is therefore contemplated that the appended claims will cover any such modifications or embodiments as fall within the true scope of the invention.

What is claimed is:

1. A transmission gate circuit, comprising:
   an electrical switch having a first terminal connected to a voltage source, a second terminal, and a third terminal forming a circuit output;
   a pull-up control circuit having a first terminal forming a circuit input and a second terminal connected to the second terminal of the electrical switch; and
   a pull-down control circuit having a first terminal connected to the circuit input and a second terminal connected to the circuit output wherein the pull-down control circuit passes the input to the output when the input transitions from low to high during a final phase of output signal transition.

2. The circuit of claim 1 wherein the electrical switch comprises a bipolar transistor further comprising:
   a base terminal forming the second terminal;
   a collector terminal forming the first terminal;
   an emitter terminal forming the third terminal.

3. The circuit of claim 1 wherein the pull-up control circuit comprises a CMOS transmission gate.

4. The circuit of claim 1 wherein the pull-up control circuit comprises a plurality of CMOS transmission gates with the gate outputs connected in parallel.

5. The circuit of claim 1 wherein the pull-down control circuit comprises a CMOS transmission gate.

6. The circuit of claim 1 wherein the pull-down control circuit comprises a plurality of CMOS transmission gates with the gate outputs connected in parallel.

7. A high speed transmission gate, comprising:
   a first CMOS transmission gate having a first terminal forming a circuit input, a first control terminal connected to a first enable voltage signal, a second control terminal connected to a second enable voltage signal, and a second terminal;
   a second CMOS transmission gate having a first terminal connected to the circuit input, a first control terminal connected to the first enable voltage signal, a second control terminal connected to the second enable voltage signal, and a second terminal forming a circuit output, wherein second CMOS transmission gate passes the input to the output when the input transitions from low to high during a final phase of output signal transition; and
   a bipolar transistor having a collector connected to a power supply, a base connected to the second terminal of the first CMOS transmission gate, and an emitter connected to the circuit output.

8. The circuit of claim 7 wherein the bipolar transistor comprises an NPN bipolar transistor.

* * * * *